United States Patent [19]
Kim et al.

[11] Patent Number: 5,943,558
[45] Date of Patent: Aug. 24, 1999

[54] METHOD OF MAKING AN ASSEMBLY PACKAGE HAVING AN AIR TIGHT CAVITY AND A PRODUCT MADE BY THE METHOD

[75] Inventors: Jong Tae Kim, Seoul; Chan Ik Park, Eumsung Koon, both of Rep. of Korea

[73] Assignees: Communications Technology, Inc.; CTI Semiconductor Corporation, both of Seoul, Rep. of Korea

[21] Appl. No.: 08/717,906

[22] Filed: Sep. 23, 1996

[51] Int. Cl.⁶ ............................................. H01L 21/44
[52] U.S. Cl. ................................. 438/125; 438/121
[58] Field of Search ........................... 438/121, 122, 438/123, 124, 125, 126, 111, 112; 257/704

[56] References Cited

U.S. PATENT DOCUMENTS

| | | | |
|---|---|---|---|
| 4,004,151 | 1/1977 | Novak . | |
| 4,139,726 | 2/1979 | Penrod et al. | 438/126 |
| 4,312,116 | 1/1982 | Moser et al. | 438/125 |
| 4,410,905 | 10/1983 | Grabbe | 438/125 |
| 4,939,316 | 7/1990 | Mahulikar et al. . | |
| 5,059,558 | 10/1991 | Tatsanakit et al. | 438/125 |
| 5,073,521 | 12/1991 | Braden | 438/122 |
| 5,465,481 | 11/1995 | Romero | 438/126 |
| 5,529,959 | 6/1996 | Yamanaka | 438/123 |
| 5,561,085 | 10/1996 | Gorowitz et al. | 438/125 |

*Primary Examiner*—Kevin M. Picardat
*Attorney, Agent, or Firm*—Peter A. Borsari

[57] ABSTRACT

A method of making an assembly package having an air tight cavity for housing an electronic element such as a GaAs semiconductor chip. The method includes the formation of a dielectric base by placing a placing a conductive lead frame comprising a frame pad and a plurality of conductive leads inside a die having a top interior surface and a bottom interior surface, injecting a thermally setting liquefied epoxy into die cavity, curing the epoxy and removing the die. The die includes at least one post which protrudes toward the die's top interior surface such that the top surface of the post presses the inner end of each of said plurality of conductive leads against the top interior surface of the die, and also includes a pin protruding from the die's top interior surface toward the post's top surface. The post firmly holds the conductive leads in a common level plane during the injection of the epoxy into the cavity while the use of the pin results in a the formation of a pin hole in the dielectric base. Once the dielectric base is formed, the conductive leads and frame pad are plated and bonded to the electronic element. A thermally setting liquefied epoxy thereafter is dispensed onto the conductive leads and the dielectric frame disposed between the leads and a shell is positioned onto the dispensed epoxy and the epoxy is cured at an elevated temperature to form a seal between the shell and the conductive leads and dielectric base. Following the bonding of the shell, the pin hole is filled with a thermally setting liquefied epoxy and the epoxy is cured. The resulting assembly package comprises an air tight cavity housing the electronic element.

19 Claims, 8 Drawing Sheets

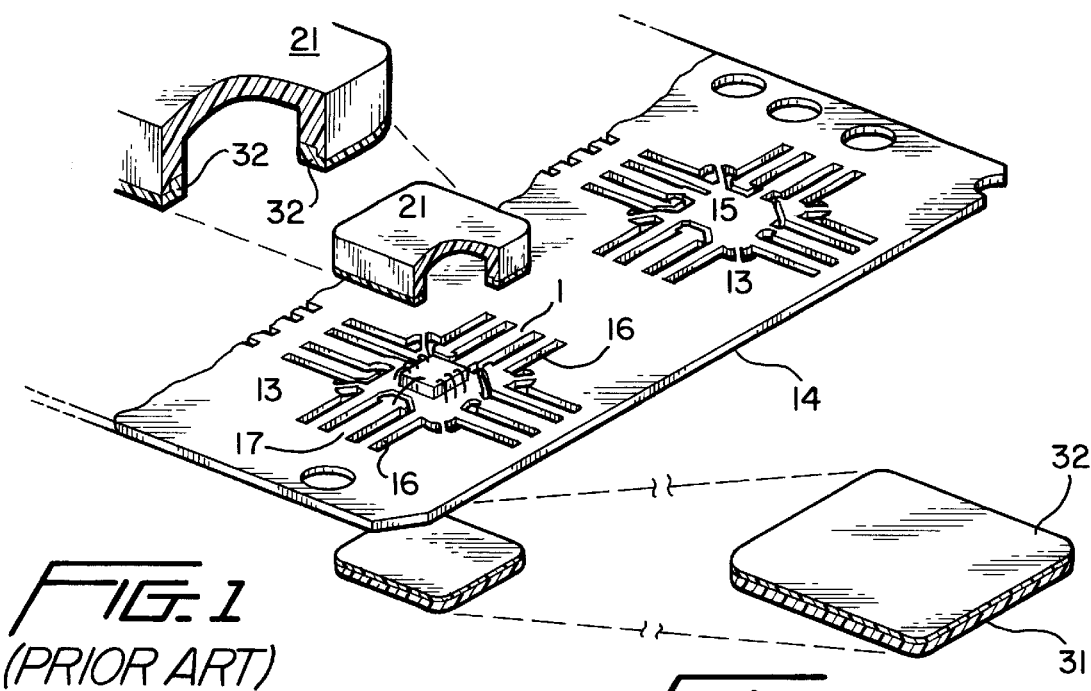
FIG. 1 (PRIOR ART)
FIG. 1(a) (PRIOR ART)
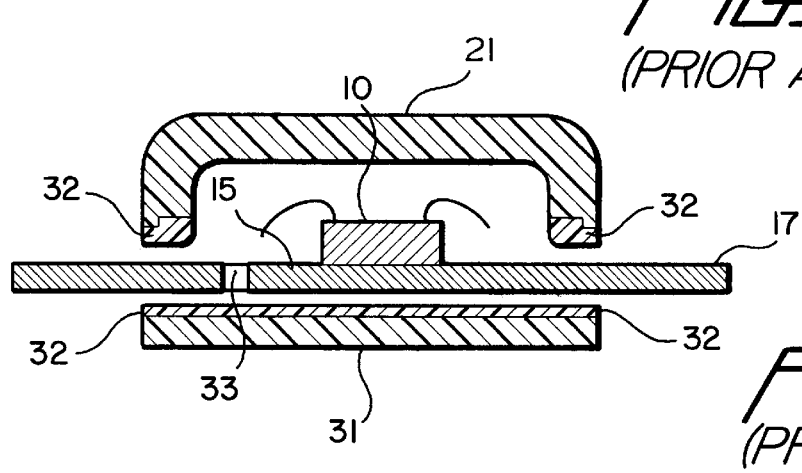
FIG. 2 (PRIOR ART)
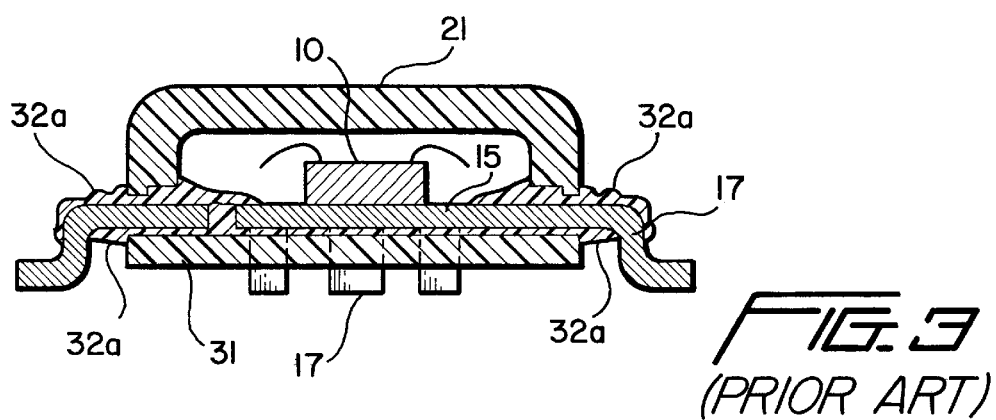
FIG. 3 (PRIOR ART)

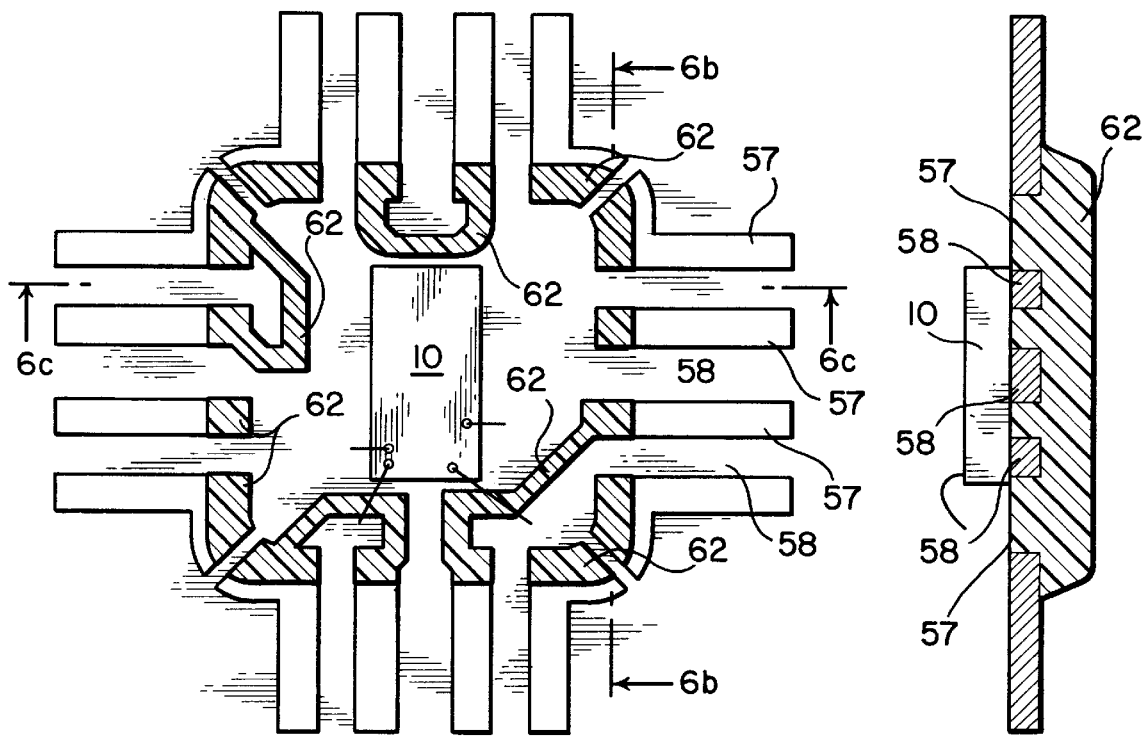
FIG. 6a
(PRIOR ART)
FIG. 6b
(PRIOR ART)
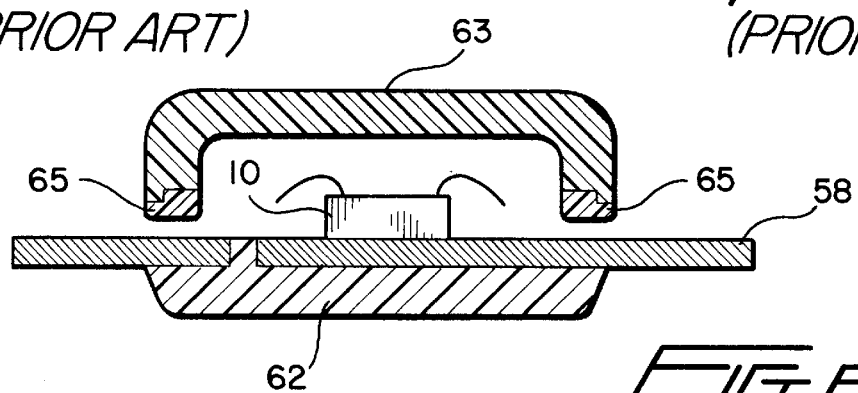
FIG. 6c
(PRIOR ART)
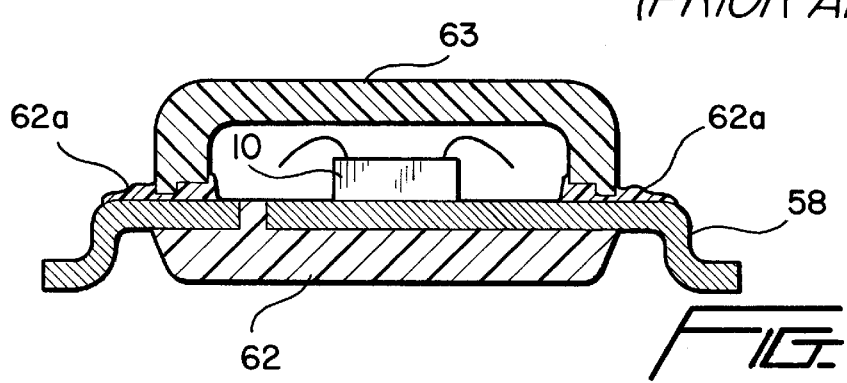
FIG. 6d
(PRIOR ART)

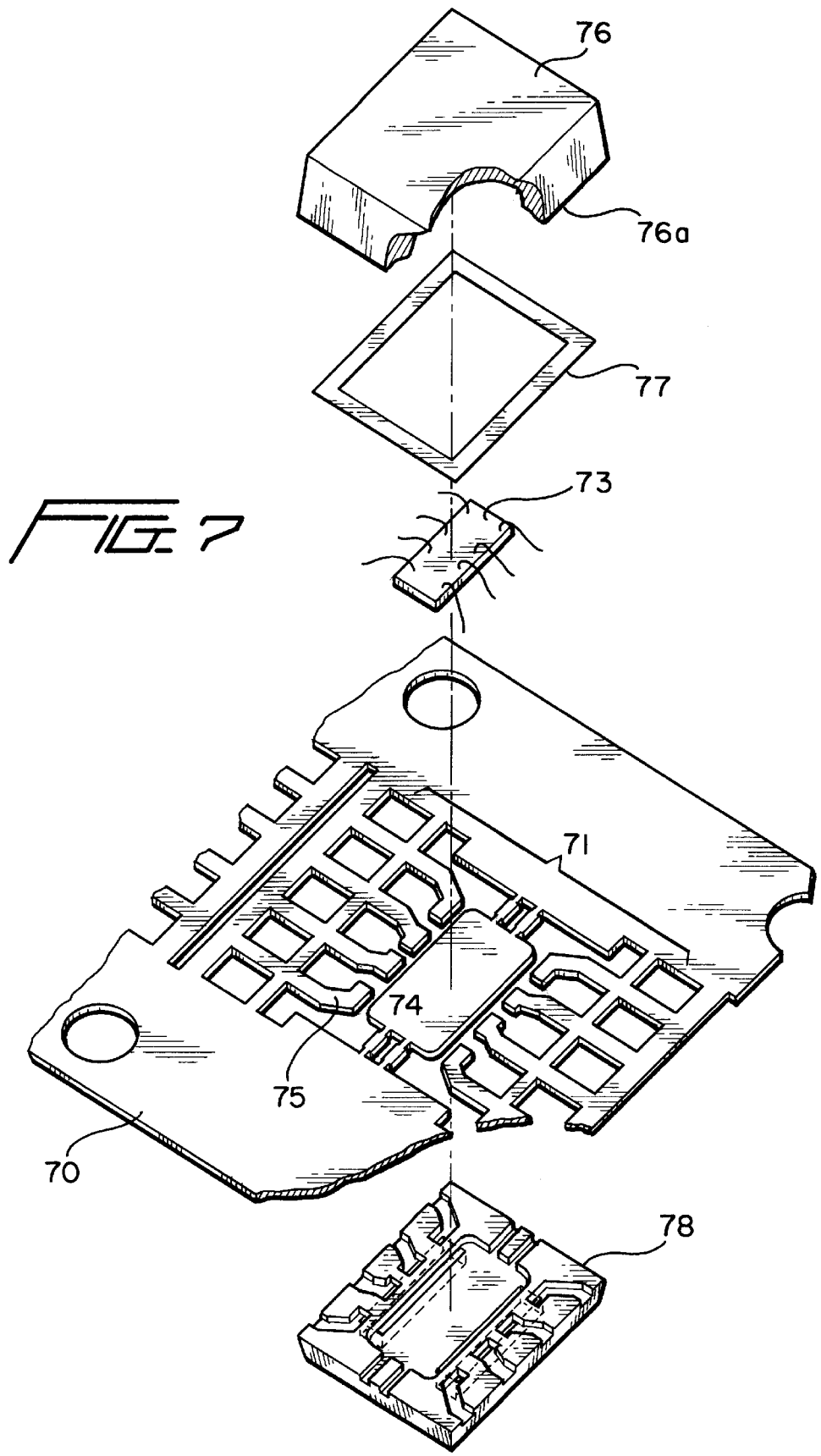

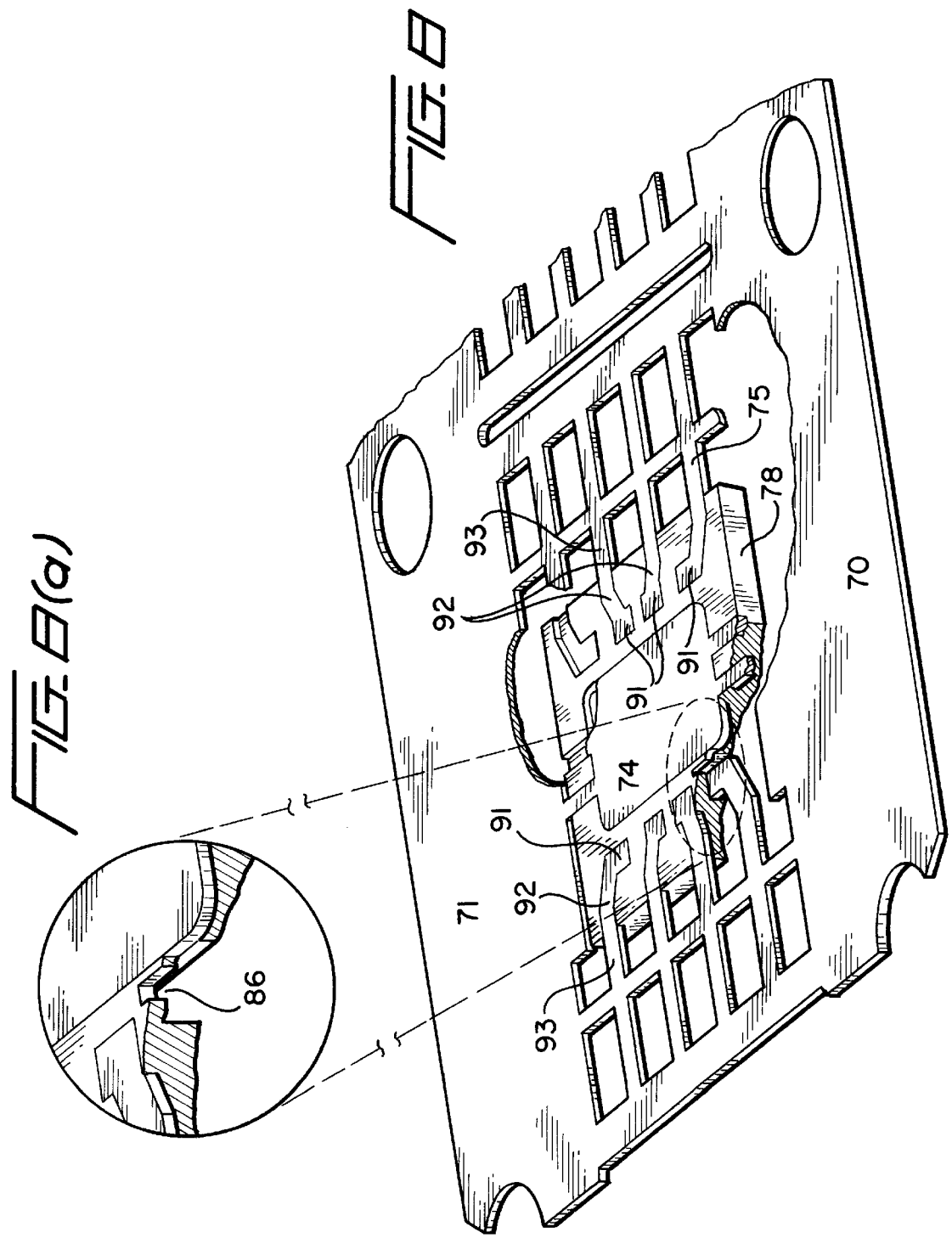

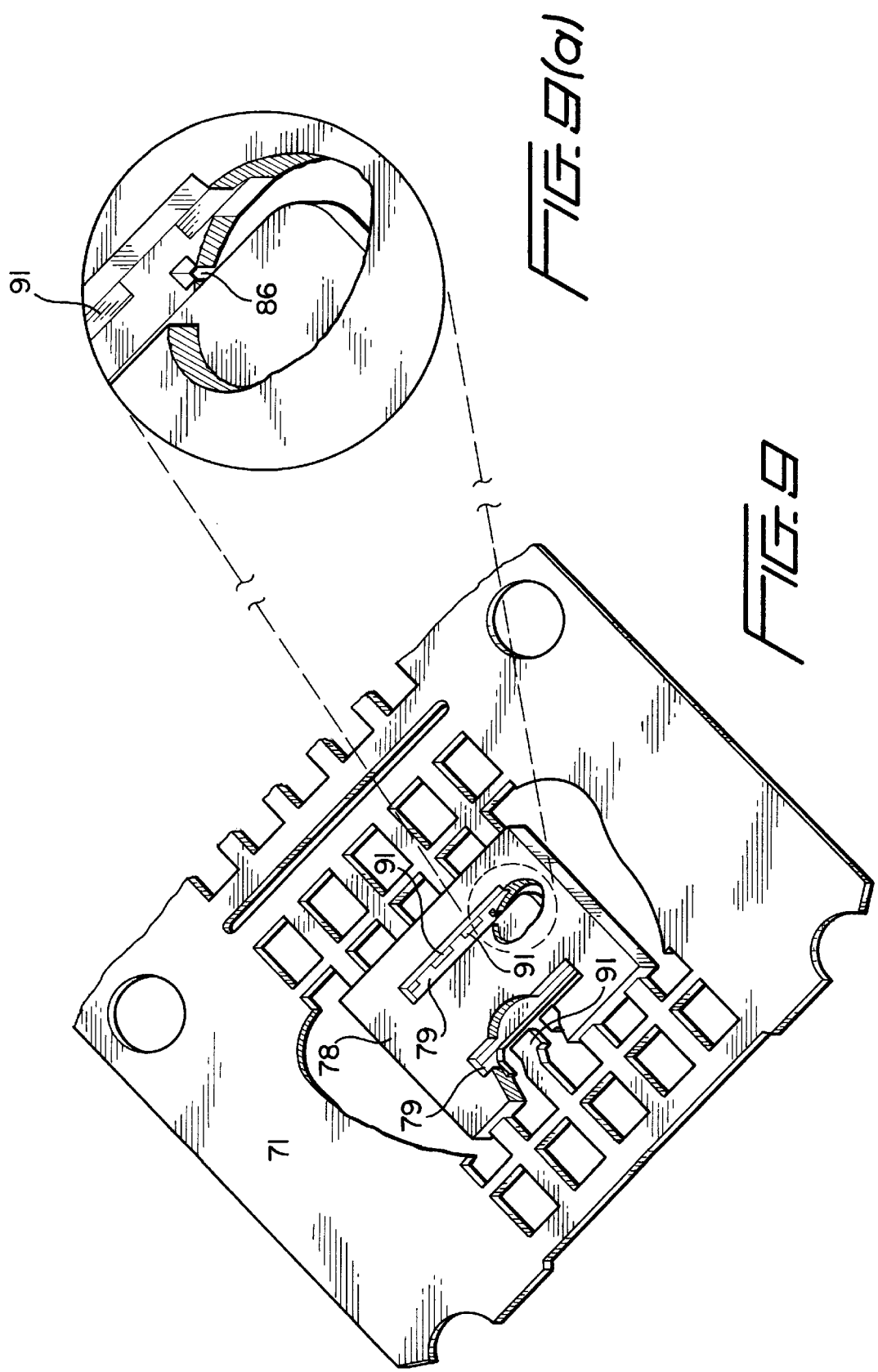

METHOD OF MAKING AN ASSEMBLY PACKAGE HAVING AN AIR TIGHT CAVITY AND A PRODUCT MADE BY THE METHOD

FIELD OF THE INVENTION

The present invention generally relates to a method of making an assembly having an air tight cavity for housing an element therein. More particularly, the present invention relates to a method of an assembly package housing a semiconductor chip, such as GaAs semiconductor circuit chip, in an air tight cavity and inventive products made by the inventive method.

BACKGROUND OF THE INVENTION

An element, such as GaAs semiconductor circuit chip, is housed in an air tight cavity in an assembly package to ensure that the chip functions in the environment in which it is designed to operate. Typically, the assembly package comprises a set of conductive frame leads and a frame pad, a semiconductor chip mounted on the pad, and a shell housing the chip. The chip is bonded to the frame pad and wire bonded to the leads of the lead frames. The cavity is formed by the shell covering the chip and the frame pad. The pad is backed by a dielectric backer plate or molded plastic.

According to a known method of making a cavity for the assembly package, a layer of epoxy in A-stage is attached to the lip of the shell and to the backer plate. Upon heating, the A-stage epoxy layer melts into a gel and bonds the backer plate to the bottom of the frame pad and the shell lip to the top of the base and the frame leads. The package is heated to a first temperature for a given duration to harden the epoxy.

In curing the epoxy, care is taken to raise the temperature outside the cavity to a temperature equal to that inside the cavity, while the epoxy is still in a liquid state. Care is taken to time the placing and pressing of the shell lip against the epoxy and covering the assembly in an enclosure to raise the outside temperature to an isothermal state while curing the epoxy. Later the assembly is placed in an enclosed oven at yet an other elevated temperature for a predetermined duration to cure the hardened epoxy.

It has been found that a known methods are difficult apply provide low production yield and poor quality products. A high percentage of the product made by the known method has been found to fail the industry standard condition "c" gross leak test and accelerated life cycle tests involving heating and freezing cycles, due to the poor quality seal of the cavities due to the fissures and cracks.

Despite the teachings of the prior art, a need still exists for a method of making an assembly package having an air tight cavity for housing an element therein which yields a high percentage of quality products which pass the industry's standard condition "c" gross leak test and accelerated life cycle tests, in an efficient manner and at an economical manufacturing cost.

SUMMARY OF THE INVENTION

Accordingly, it is an object of the present invention to provide a method of making an assembly package having an air tight cavity for housing an element therein which yields a high percentage of assembly packages having an air tight seal.

It is another object of the present invention to provide a method of making an assembly package having an air tight cavity for housing an element which yields a high percentage of assembly packages which pass the industry standard condition "c" gross leak test and accelerated life cycle tests.

It is still another object of the present invention to provide a method of making an assembly package having an air tight cavity for housing an element therein which does not cause the epoxy bonding the dielectric shell to the dielectric base to form dribbles of epoxy outside the bonding area.

It is a further object of the present invention to provide a method of making an assembly package having an air tight cavity for housing an element therein which does not cause the epoxy bonding area between the dielectric shell and dielectric base to crack or fissure during trimming and bending operations.

It is an additional object of the present invention to provide a method of making an assembly package having an air tight cavity for housing an element therein in which a mold die is used which firmly retains conductive leads in a common level plane during the formation of the dielectric base.

It is yet another object of the present invention to provide a method of making an assembly package having an air tight cavity for housing an element therein in which the mold die used in the formation of the dielectric base is configured to press the conductive leads against the top interior surface thereof and to form a pinhole in the dielectric base.

It is still another object of the present invention to provide a method of making an assembly package having an air tight cavity for housing an element therein which enables the manufacture of a very high yield of air tight assembly packages in a shorter period of time and in an economical manner.

Additional objects, advantages and novel features of the invention will be set forth in part in the description which follows, and in part will become apparent to those skilled in the art upon examination of the following specification or may be learned by practice of this invention.

These and other objects of the invention, as embodied and broadly described herein, are achieved by providing a novel method of making an assembly package having an air tight cavity for housing a circuitry element, such as a GaAs semiconductor chip. The chip is mounted onto a frame pad and is wire bonded to conductive leads inside the cavity. The conductive leads extend outwardly through the assembly package such that their outer ends are located outside the package. The frame pad and conductive leads are supported by a dielectric base formed by transfer molding a thermally setting epoxy in a mold die. The interior cavity of the mold die is configured such that a pin hole is formed through the dielectric base. The interior cavity also is positioned with at least one post and preferably two posts, the post(s) being positioned such that they hold and retain the inner ends of the conductive leads firmly in place in a common level plane against the top interior surface of the mold die while the epoxy is injected in the cavity to form the dielectric base. In this manner, any seepage of the epoxy onto the top surfaces of the conductive leads is prevented.

A dielectric shell is bonded to the conductive leads and the dielectric base between the leads by a thermally setting epoxy. The resulting assembly package is heated to cure the epoxy and form an air tight seal between the dielectric shell and the conductive leads and dielectric base. Thereafter, the pin hole in the dielectric base and the recess(es) formed by the post(s) are filled with an epoxy and cured, thereby forming an air tight cavity.

The present invention will be described in terms of a method of making an air tight cavity in a package containing a GaAs semiconductor chip and a product made by the present inventive method with reference to the accompanying drawings. But it should be noted that the principles of the inventive method are not limited to making the cavity for the GaAs or any other type of semiconductor chips. The inventive method may be widely applied to make air tight cavities which contain other types of products, including for example, LCD, MMIC and other electronic or non-electronic elements. Likewise the present inventive method and products are not limited to the GaAs semiconductor assembly packages but may be applied to other types of assembly packages.

The foregoing and other aspects of the invention will be clearer in the detailed description in conjunction with the accompanying drawings.

BRIEF DESCRIPTION OF THE DRAWINGS

FIGS. 1–4 show various views of a semiconductor assembly package with a cavity for housing a GaAs chip made by a prior art method.

FIG. 6 shows another embodiment of an prior art assembly.

FIG. 7 shows an exploded perspective view of the assembly elements of the present invention.

FIG. 8 shows a top view of the lead frame with the transfer molded epoxy forming the dielectric base of the present invention.

FIG. 9 shows a bottom view of the dielectric base made of the transfer molded epoxy of the present invention.

DETAILED DESCRIPTION OF THE PRIOR ART

Figure 4:
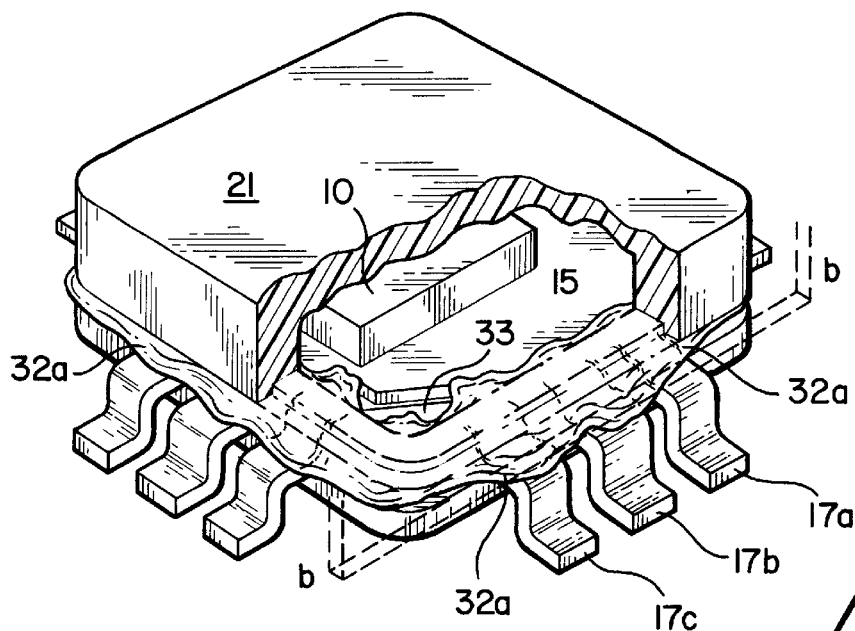

A known method of making a semiconductor assembly package with an air tight cavity will be described with reference to FIGS. 1–5. As shown in FIGS. 1–5, an assembly package contains a circuit element such as a GaAs semiconductor chip 10. The package includes a lead frame 13 made of the conductive plate 14. A plurality of lead frames may be stamped into a conductive strip, in a conventional manner, as partially shown in FIG. 1. The bottom of the chip is bonded to the frame pad 15 of the lead frame. The elements of the chip are wire bonded to the frame leads 17 of the lead frame. A shell 21 made of a non-conductive material covers the chip.

According to a known method, an epoxy compound is used to bond the shell to the frame leads 17 and form the cavity for the GaAs chip. The prior art method includes heating a shell 21 tipped with epoxy 32 and a backer plate 31 coated with epoxy 32, such that the epoxy is made to melt into a gel state. The shell and the backer plate are pressed against the frame pad 15. The epoxy bonds the shell to the frame leads, thereby forming the cavity for the chip. The resulting assembly package is placed in an oven for a predetermined duration at a predetermined temperature to harden and cure the epoxy. This package is again placed in an oven at a higher temperature for another duration to cure further and stabilize the hardened epoxy. The foregoing method is applied to mass produce the packages by making a large number of the lead frames 13 in the conductor strip 14 at the same time.

Figure 5A:
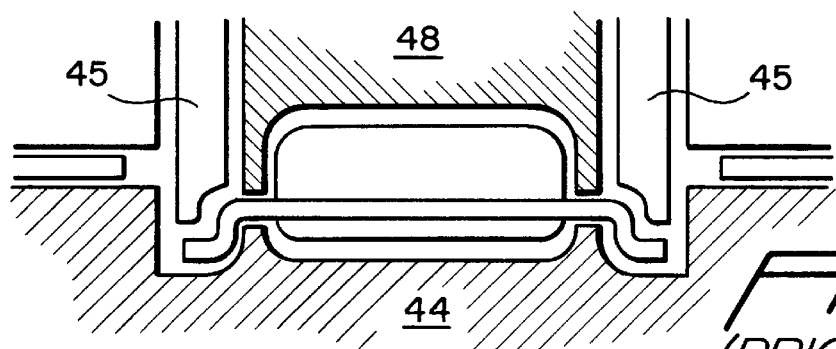
FIGS. 5A and 5B show a frame lead forming tool set that trims and bends the frame leads into gull wings.
Figure 5B:
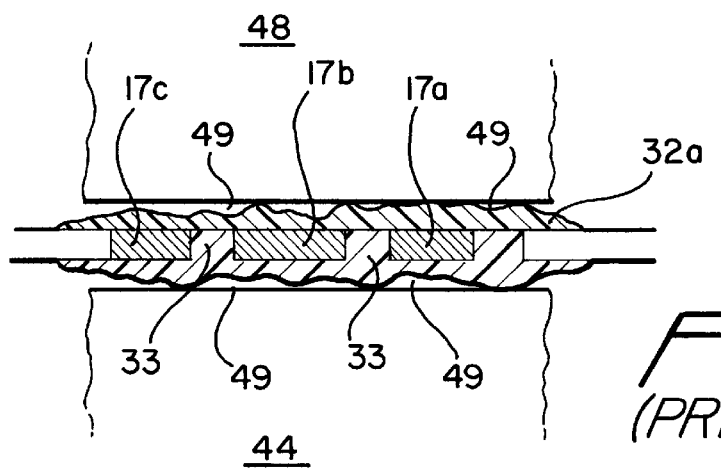

The product made by the foregoing method was found to be deficient in many respects. The pressure applied to the epoxy to bond the shell to the leads caused the epoxy to ooze out over the frame leads in dribbles 32a and into the cavity, as shown in FIGS. 3, 4 and 5B. The dribbles 32a cause the epoxy to crack, fissure or open up and separate the lip of the shell from the leads during the trimming and bending operation.

The cracks and fissures are caused by the irregular dribbles spilled over the frame leads which have gaps 49 of different shapes and depths between the stripper 48 and the anvil 44, as shown in FIG. 5B. As the stripper 48 presses the frame leads against the anvil 44, some leads 17a are gripped and others 17b, 17c are not gripped. As a puncher 45 comes down to press the leads against the anvil 44, it cuts and bends the frame leads into the shape of gull wings.

Because of the gaps 49 (FIG. 5B) of different depths of the dribbles, the stripper and the anvil do not grip all of the frame leads with the same uniform, even and stable pressure. Some leads are gripped and others not, as the puncher 45 comes down to cut and bend. As the form puncher 45 comes down hard to bend, the leads not gripped firmly move and bend relative to the leads that are gripped and held tight. This sends shock waves through the frame leads to the epoxy between the shell lip and the frame pad. This causes the epoxy between the lip and leads to crack or fissures or open up the contact between the lip of the shell and frame pad or between the frame leads and epoxy, as illustrated in FIG. 4. This makes the cavity no longer air tight.

According to another known method, the base dielectric backer plate and frame leads come in one piece after they are either injection molded or transfer molded in a conventional manner with plastics, as will be described with referenced to FIG. 6. In the epoxy molding process, the epoxy 62 is used to fill the channels 57 between the frame leads 58 and back of the frame base. This is shown in cross hatched form 62 in FIG. 6. The mold is so designed that the surface of frame leads 58 and the epoxy surface 57 between the leads are even and level as shown in FIG. 6b.

The shell 63 with its lip 65 tipped with an epoxy are heated at an elevated temperature to melt. The shell lip is placed on the base against the frame leads so that the molten epoxy meets the frame leads and bonds the lip to the frame leads to form the air cavity for the GaAs chip, as described before.

As in the earlier case described above with reference to FIGS. 1–4, the epoxy 62a oozed out and dribbled over the leads and the base as shown in FIG. 6d. The dribbles 62a on the frame leads formed the irregular and uneven gaps, as before. This caused the epoxy betweens the shell lip and base to crack, fissure or lift the shell lip away from the epoxy, as before when the leads are cut and gull winged (see FIG. 5). This resulted in a leaky air cavity.

The assembly packages made by the above-described methods were tested after the frame leads were trimmed and gull winged, according to the industry standard condition "c" gross leak test and accelerated heating and freezing life cycle tests. A very high percentage of the packages failed the tests, indicating that the known methods provided poor yield.

DETAILED DESCRIPTION OF THE INVENTION

The present invention is directed to a method of making an assembly package having an air tight cavity, said assembly package comprising (1) a conductive lead frame composed of a thin conductive plate, said lead frame comprising a frame pad having a top surface and a bottom surface and a plurality of conductive leads, each of said conductive leads having a top surface, a bottom surface, an inner end positioned adjacent said frame pad, an intermediate portion and an outer end, said frame pad and conductive leads being disposed in a common level plane, (2) a circuitry connected to said inner ends of said conductive leads, (3) a dielectric base, and (4) a shell, wherein the method comprises the steps of
(a) forming a dielectric base by
   (a1) placing a conductive lead frame composed of a thin conductive plate, said lead frame comprising a frame pad and a plurality of conductive leads inside a die, said die comprising (1) a top interior surface configured for contacting the top surfaces of said conductive leads and of said frame pad, (2) a bottom interior surface spaced from the bottom surfaces of said frame pad and of said conductive leads, (3) at least one and preferably two posts protruding from said bottom interior surface toward said top interior surface, each of said posts having a top surface which presses the inner ends of each of the plurality of said conductive leads adjacent the pad against the top interior surface, and (4) a pin protruding from top interior surface and extending to said top surface of said posts, whereby a cavity space is created within the interior of the die which is configured to form a dielectric base of a predetermined shape,
   (a2) heating the die to a first elevated temperature;
   (a3) filling said cavity space with a thermally setting liquefied epoxy;
   (a4) curing the injected epoxy to form said dielectric base; and
   (a5) removing said die;
(b) plating said plurality of conductive leads and said frame pad;
(c) bonding a circuitry to said frame pad and wire bonding said circuitry to said inner end of each of said plurality of conductive leads;
(d) dispensing a thermally setting liquefied epoxy onto said intermediate portion of each of said plurality of conductive leads and onto said dielectric base disposed between said conductive leads;
(e) positioning a shell having a rim about the periphery thereof onto the dispensed epoxy to bond said rim to said plurality of conductive leads and to said dielectric base disposed between said conductive leads and heating and curing said epoxy to bond said shell to said dielectric base and conductive leads;
(f) dispensing a thermally setting liquefied epoxy into said hole and said recess; and
(g) curing the epoxy disposed in said hole and said recess to form an air tight cavity housing said circuitry.

More particularly and referring to FIG. 7, the assembly package made in accordance with the present invention comprises a conductive strip 70 comprising at least one and preferably a plurality of conductive lead frames 71, each of said conductive frames 71 having a set of a plurality of conductive leads 75 and a frame pad 74. Each assembly package further comprises a semiconductor chip 73 bonded to the frame pad 74 with a conductive adhesive and wire bonded to the plurality of conductive leads 75 and a shell 76 bonded to the top surface of the conductive frame 71 by an epoxy 77. Each of said plurality of conductive leads 75 has an inner end 91, an intermediate portion 92 and an outer end portion 93 as shown in FIG. 8.

In making the assembly packages, a thin planar conductive strip 70 from which a certain pattern is punched or etched out in repetition forms a plurality of conductive lead frames 71. Each of the conductive lead frames 71 is placed inside a mold die having a predetermined design as described above. While it is to be understood that the present invention relates to a method of making a plurality of assembly packages from a conductive strip 70 having a plurality of conductive lead frames 71, in order to facilitate discussion, the following description will detail the making of one assembly package.

As shown in FIG. 7, the bottom surface of each of the plurality of conductive leads 75 is supported by a dielectric base plate 78 which is prepared from a thermally setting transfer molded epoxy in a mold die. The dielectric base plate 78 is formed by transfer molding a thermally setting epoxy in a predetermined shape in a mold die. The transfer molded epoxy forms the dielectric base to support the conductive leads 75 and the frame pad 74.

More specifically and referring to FIGS. 7 to 10, the inner ends 91 of the conductive leads 75 adjacent the frame pad 74 are retained within a cavity space of a predetermined shape inside of a mold die, the shape of which is such that it forms the dielectric base 78. The mold die comprises a top interior surface and a bottom interior surface. The top interior surface of the die is flat and is designed to contact and press against the top surfaces of the conductive leads 75 and the frame pad 74.

The bottom interior surface of the die is spaced away from and faces the bottom surfaces of the conductive leads and the frame pad. The mold die also is provided with at least one post and preferably two posts which protrude from the bottom interior surface of the die and directed toward the bottom surface of the conductive leads and the frame pad. The posts are dimensioned such that the top surfaces of the posts press the inner end portion 91 of each of the plurality of conductive leads against the top interior surface of the die. The recesses 79 shown in FIG. 9 are channels or recesses made by the posts during the formation of the dielectric base 78. In this manner the inner end portion 91 of each of the plurality of conductive leads 75 is pressed by the posts firmly against the top interior surface of the die. The periphery of both the top and the bottom interior surfaces are closed such that the empty interior or cavity space enclosed by the two interior surfaces and the periphery defines the shape of the dielectric base 78.

The mold die also is provided with a pin protruding from the top interior surface and towards the top surface of the posts. The disposition of the pin results in the formation of a pinhole 86 through the dielectric base 78 when the dielectric base 78 is formed by the injection molding process. The thus-formed pin hole serves as an escape path for heated air within the resulting cavity during the manufacturing process, thereby relieving pressure that would otherwise build up within the cavity.

In forming the dielectric base, careful placement of the plurality of conductive leads 75 and frame pad 74 is required such that the top surfaces of each of the plurality of conductive leads 75 and the top surface of the frame pad 74 abuts against the top interior surface of the die. At the same time, the pin protruding into the interior space must be located between the frame pad 74 and one of said conductive leads 75 in order to ensure that the pin extends from the top interior surface of the mold die to the top surface of the posts. Further, careful positioning of the conductive frame and conductive leads is required in order to insure that the top surface of the posts presses against the bottom surface of the conductive leads at the inner end portions 91 thereof adjacent the frame pad as illustrated in FIGS. 8 and 9.

After each of the conductive lead frames 71 disposed on conductive strip 70 is housed inside a corresponding die, the assembly package, that is, the conductor strip and the corresponding mold dies, are heated to an elevated temperature of 175° C.±5° C. A suitable thermally setting epoxy is injected into the die interior cavity, while the temperature of the die is maintained at the elevated temperature of 175° C.±5° C. An example of a suitable thermally setting epoxy is Sumitomo EME 6300H. The injected epoxy melts and fills the cavity space in the interior of mold die. As the epoxy solidifies, it forms into a predetermined shape resulting in dielectric base 78, as shown in FIG. 7.

The dielectric base bonds conductive leads 75 and the frame pad 74 as illustrated in FIGS. 7 to 10. Because of the plane defined by the top surfaces of the mold die, the dielectric base 78 formed by the transfer molded epoxy becomes a integral part of a unitary structure with the conductive leads and the frame pad. This unitary structure maintains the top surfaces of the conductive leads 75 in the same common plane and maintains the spatial integrity among and between said conductive leads and the frame pad 74. This spatial integrity is maintained by the posts pressing the inner end portions 91 of the bottom surface of each of the plurality of conductive leads 75 against the top interior surface of the mold. In this manner, the conductive leads are held firmly in the same common plane, while the epoxy is injected into the cavity space inside the mold die.

In the absence of the use of the posts in the mold die, the conductive leads 75 would not be retained against the top interior surface of the mold die, and the conductive leads would wobble or shake under the pressure formed while the epoxy is injected into the empty cavity space in the die mold. If this were to happen, the conductive leads would not remain in place and the top surface would not remain in the same level plane where they were positioned originally. As a result, the epoxy would smear into the space between the top interior surface of the mold die and the top surfaces of the conductive leads and the frame pads. The epoxy smeared on the surfaces of the conductive leads and frame pads would make it difficult to plate the conductive leads and pads and later the die bonding and wire bonding operations of the chip.

Thus, retention of the conductive leads in their original placement position makes it possible to wire bond the frame leads to the GaAs chips automatically at a high speed with highly reliable results. This inventive aspect contributes quite significantly to the increase of the yield in the die bonding and wire bonding processes which take place later in the manufacturing process.

Following the solidification of the epoxy, the die is removed, leaving recesses 79 where the posts were disposed and a pin hole 86 where the pin was disposed. Thereafter, the conductive leads 75 and the frame pad 74 are plated with a conductive metal in a conventional manner as is well known in the prior art. Following this plating step, a semiconductor chip, such as a GaAs chip, is bonded onto the frame pad and wire bonded to the conductive leads 75, also by conventional means well known in the prior art.

Following the bonding of the semiconductor chip to the frame pad and conductive leads, the conductive frame 71 is covered with a shell 76. A thermally setting liquefied epoxy is used to bond the shell 76 to the frame 71 by dispensing the epoxy in the form of a bead 77 onto the intermediate portions 92 of each of the plurality of conductive leads 75 and onto the dielectric plate disposed between the conductive leads corresponding to the protruding rim or lip 76a of the shell 76. The shell 76 is placed on the epoxy 77 such that the epoxy bonds the lip 76a of the shell to each of the plurality of conductive leads and to the dielectric plate 78. In this manner, the shell is bonded to the conductive leads and dielectric plate between the conductive leads, thereby sealing the cavity that houses the semiconductor chip. A suitable thermally setting epoxy contemplated for use by the present invention is "NPR-770 NP4", manufactured and sold by JAPAN REC. The NPR-770 NP4 epoxy is characterized by having a short gelation time and curing at low temperature. This epoxy also exhibits good hardness and high adhesion to epoxy molding compounds, low deformation and high resistance against thermal aging and shock, and high reproducibility with a low thixotropic index.

Figure 11:
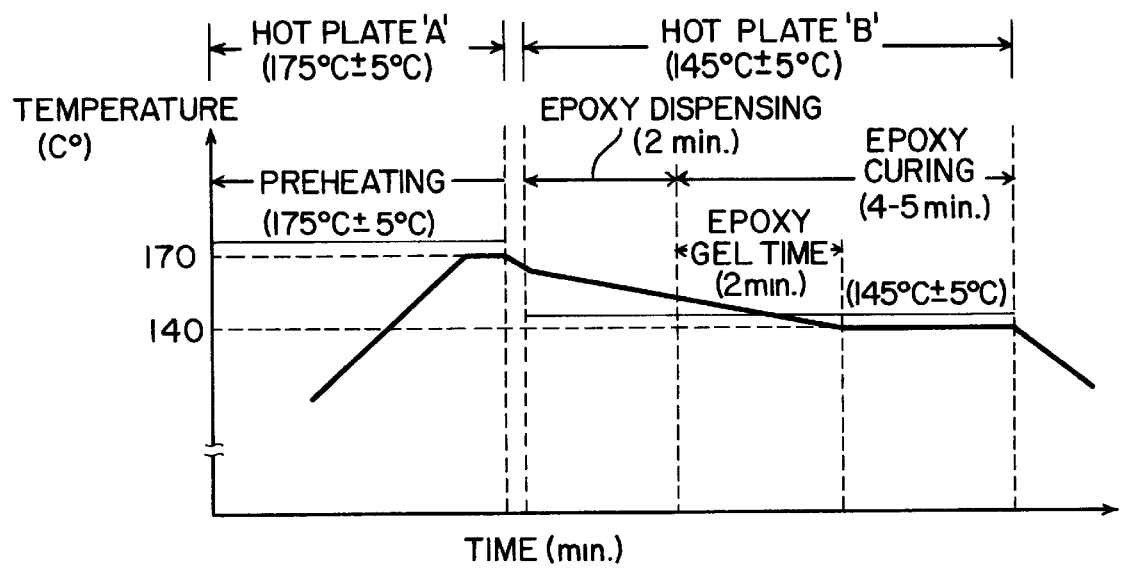
FIG. 11 shows the heating and cooling steps involved in sealing the pin hole and the recesses with epoxy and gelling and hardening the epoxy over time.

After the shell is bonded to the conductive leads and the dielectric base of the conductive frame as described above, the assembly package is heated to a predetermined elevated temperature in order to cure the epoxy and form an airtight seal between the shell and the dielectric base. In a preferred embodiment, the assembly package is placed on a first hot plate which pre-heated to an elevated temperature, such as 175° C.±5° C. and the package is heated to the elevated temperature. Once the assembly package reaches this elevated temperature, it is cooled to a lower temperature, for example to about 140° C. ±5° C. by transferring the heated assembly package to a second hot plate which has been pre-heated to the lower temperature of about 140° C.±5° C. and preferably about 145° C. During the cooling of the assembly package to the lower temperature, the pin hole and the recess or recesses (formed by the post or posts) are filled with a thermally setting epoxy, such as NPR-770 NP4, supplied by Japan REC. The epoxy in the pin hole and recess(es) gels and hardens over a period of time, thereby sealing the pin hole and forming an air tight cavity. During the cooling of the assembly package on the second hot plate, the pressure from the air in the cavity decreases. Once the pin hole has been filled with the thermally setting epoxy, the epoxy sealing the pin hole may bubble or puncture but the epoxy will remain intact therein, thereby ensuring an air tight seal. The gelling and hardening of the epoxy in the pin hole is illustrated in FIG. 11.

Figure 12:
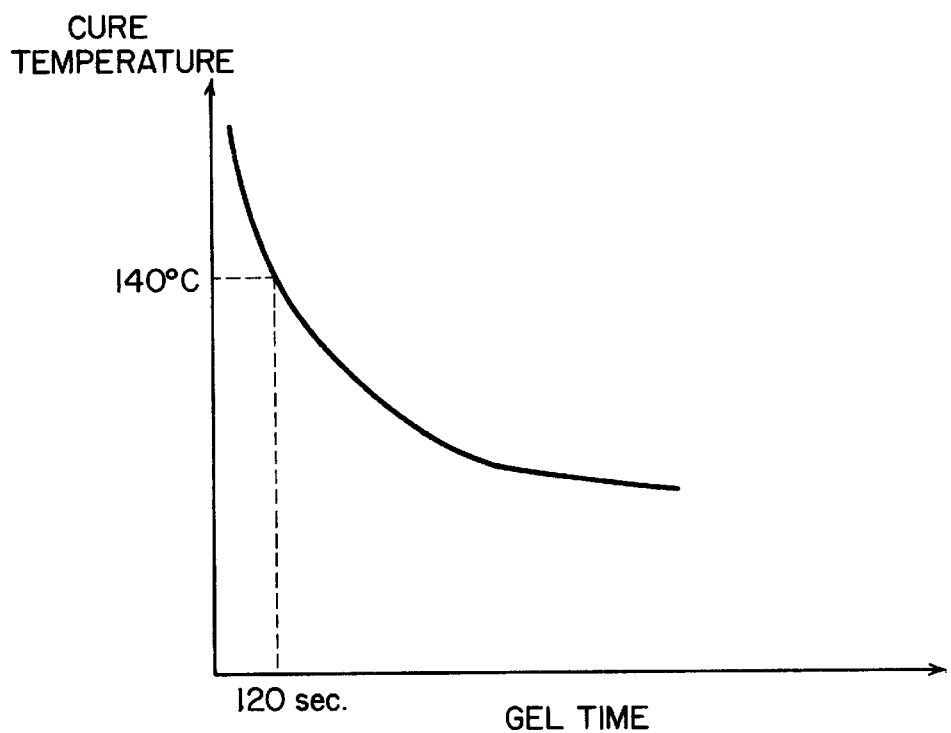
FIG. 12 shows the temperature versus the gelling and hardening relationship at different temperatures.

The selection of the temperature of the two hot plates is related to the period of time required by the liquefied epoxy to gel and harden. As illustrated in FIG. 12, at a higher temperature, the gelling and hardening requires a shorter period of time while at a lower temperature, a longer gelling and hardening time is required. Thus, over a temperature range of about 90° C. to about 150° C., the epoxy gels over a period of about two to about three minutes and afterward the epoxy hardens over about two minutes. It is to be understood that the epoxy must be dispensed at a sufficient temperature to enable gelation of the epoxy.

When a plurality of the assembly packages are being prepared in a batch on a conductive strip, it is desirable to stretch or extend the cooling period of the assembly package in order to the provide a sufficient amount of time to dispense the epoxy to each of assemblies on the conductive strip before the epoxy dispensed to the first assemblies in the strip begins to gel and harden. One manner to extend the cooling period such that the epoxy is dispensed to the entire set of assembly packages before the epoxy is gelled is to place the conductive strip on a thick metal hot plate such that a longer cooling time is required once the heat for the hot plate has been cut off.

From extensive experimentation, it was determined that the assembly can be heated to about 170° C. without adversely affecting the characteristics of epoxy due to thermal shock, and then cooled to about 140° C. by using the two pre-heated hot plates, the first hot plate pre-heated to about 175° C., and the second hot plate pre-heated to about 145° C, as described above. The use of the two pre-heated hot plates provided a sealing and gel time of about three (3) minutes and a hardening time of about two (2) minutes. In a sealing and gelling period of about two (2) minutes, as many as 200 assembly packages were sealed using an auto dispenser. After the sealing and gelling with the thermally setting epoxy, the epoxy hardened in about two minutes and then the assembly packages were removed from the second hot plate for a further curing process in an oven.

In an alternate embodiment, the curing of the epoxy between the shell and the conductive leads and the dielectric base is performed in two stages. In the first stage, the assembly is heated to about 150° C.±5° C. for about 20 minutes. In the second stage, the assembly is flipped over and heated to about 175° C.±5° C. for about three minutes. During this two stage curing cycle at the two elevated temperatures, the air heated inside the cavity between the shell and the dielectric base is vented through the pin hole 86. The assembly package then is cooled as described above and the pin hole 86 and the recesses 79 left by the posts are filled with a thermally setting liquefied epoxy during the cooling period.

As noted above, the conductive strip of assembly packages having an air tight cavities may be transferred to an oven at an elevated temperature to formally cure and stabilize the epoxy bond. Preferably, the oven is pre-heated to a temperature of 150° C.±5° C. for a period of about 2 hours. Once it has been determined that the epoxy is cured and stabilized, individual assembly packages can be prepared by a conventional stamping and gulling operation as is well known in the prior art.

The assembly packages made by the present inventive methods are superior in quality and performance. This was verified by subjecting the resulting assemblies made in accordance with present invention to the accepted industry standard condition "C" gross leak test and accelerated heating and freezing life cycle tests.

Furthermore, by using the inventive method described above, the inventors achieve significantly higher production yield, that is, very few of the assemblies had to be rejected because of the defects in the final assemblies. It fact, in this regard the yield by the present assembly packaging method was as high as 99% or higher, as opposed to a yield of around 70% according to the prior art method. In addition, the present inventive method also makes it possible to manufacture the assembly packages in a shorter period of time than by the prior art method, by utilizing the pin hole 86 to vent the heated air during the curing processes.

It was found that if there is no pin hole to vent the heated air in the cavity, the time to cure the liquefied epoxy bonding the shell to the frame leads took substantially longer and the curing had to take place at a much lower temperature. For example, the time to cure in the prior art method took about one hour and the curing temperature had to be maintained at about 90° C.

By providing the pin hole to vent the heated air, the curing temperature can be elevated to 175° C.±5° C. from an initial temperature of 150° C.±5° C. and the curing time of the epoxy can be reduced from about sixty minutes to about three minutes, while producing an excellent air tight seal. This not only significantly reduces the assembling time but also substantially increased the reliability of the end product. By providing the escape pin hole, the bonding of the shell to the conductive leads and dielectric base, and the sealing of the cavity housing the chip can be performed in two separate and independent steps. This separation of the bonding and sealing steps facilitates the formation of the air tight cavity at shorter periods of time at higher temperature with higher reliability and higher yields than the prior art methods.

Figure 10A:
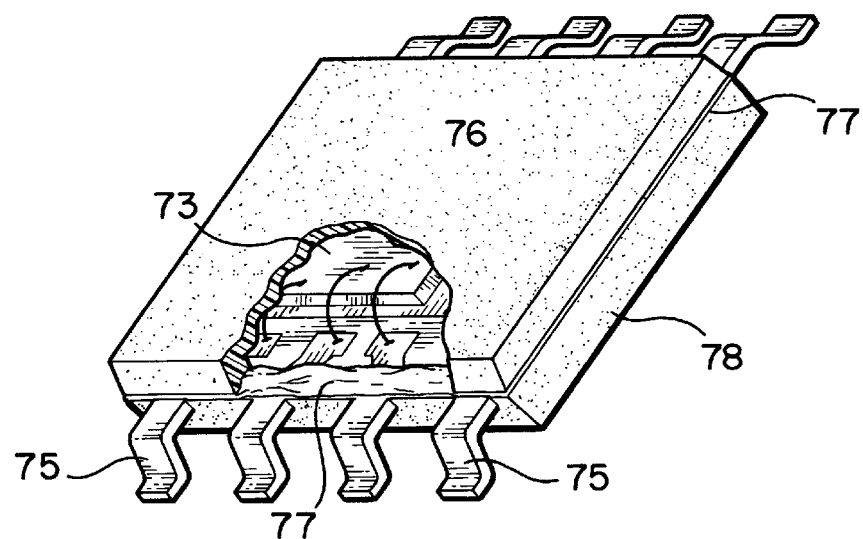
FIG. 10A shows a perspective view of an assembly package made according to the present invention.
Figure 10B:
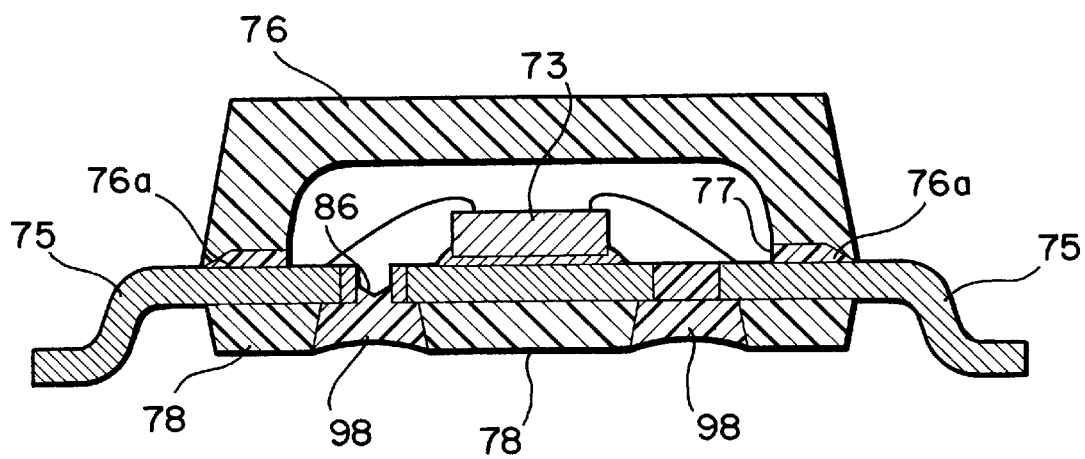
FIG. 10B shows a side cross sectional side view of the final assembly package made according to the present invention.

The use of the thermally setting epoxy bonding the shell to the frame leads was also found to be beneficial due to the fact that because the epoxy is in a liquid state, no pressure is necessary to bond the lip of the shell to the conductive leads and the dielectric base. As a result, it was found that no dribbles spilled over outside the lip, as was the case with the prior art method. Rather, the epoxy remained between the lip and the conductive leads, as shown in FIGS. 10A and 10B. Thus, when the stamping and gulling operation is carried out to form the individual assembly packages, as in a conventional manner, there are no fissure, cracks or fractures, as was the case with the assembly made according to the prior methods as described above.

Various modification of the present inventive method and inventive product by the method may be made the persons of ordinary skills without deporting from the spirit and scope of the present invention.

What is claimed is:

1. A method of making an assembly package comprising the steps of:

(a) forming a dielectric base comprising the steps of:

(a1) placing a conductive lead frame comprising a frame pad and a plurality of conductive leads, each of said leads having an inner end, an intermediate portion and an outer end, inside a die, said die comprising (1) a top interior surface, (2) a bottom interior surface, (3) at least one post having a top surface, said post protruding from said bottom interior surface toward said top interior surface, and (4) a pin protruding from said top interior surface and extending to said top surface of said post, said plurality of conductive leads being positioned within said die such that said top surface of said post presses the inner end of each of said plurality of conductive leads against said top interior surface of said die, whereby the cavity created within the interior of the die is configured to form a dielectric base of a predetermined shape, (a2) filling said cavity space with a thermally setting liquefied epoxy, (a4) curing the injected epoxy to form said dielectric base, whereby said dielectric base includes a pin hole made by said pin and a recess made by said post, and (a5) removing said die;

(b) plating said plurality of conductive leads and said frame pad;

(c) bonding a circuitry to said frame pad and wire bonding said circuitry to said inner end of each said plurality of conductive leads;

(d) dispensing a thermally setting liquefied epoxy onto said intermediate portion of each of said plurality of conductive leads and onto said dielectric base disposed between said conductive leads;

(e) positioning a shell having a rim about the periphery thereof onto the dispensed epoxy to bond said rim to said plurality of conductive leads and to said dielectric base disposed between said conductive leads and heating and curing said epoxy to bond said shell to said dielectric base and conductive leads;

(f) dispensing a thermally setting liquefied epoxy into said pin hole and said recess; and (g) curing the epoxy disposed in said pin hole and said recess to form an air tight cavity housing said circuitry.

2. The method of making the assembly package according to claim 1, wherein the heating and curing of the epoxy in step (e) comprises heating the assembly package to a first predetermined elevated temperature and then cooling the heated assembly package to a second predetermined elevated temperature, said second temperature being lower than said first temperature, and wherein, the dispensing of the epoxy in step (f) into said pin hole and said recess is conducted during the cooling of the heated assembly, such that the epoxy in said pin hole and said recess gels and hardens as the heated assembly is being cooled to said second temperature.

3. The method of making the assembly package according to claim 2, wherein the first elevated temperature is from about 170° C. to about 180° C. and the second elevated temperature is from about 140° C. to about 150° C.

4. The method of making the assembly package according to claim 3, wherein said assembly package is cooled to the second elevated temperature in a period of about three to about five minutes.

5. The method of making the assembly package according to claim 4, wherein said assembly package is cooled in about four minutes and said pin hole and said recess are sealed with said epoxy at a temperature of about 145° C.

6. The method of making a plurality of assembly packages according to claim 2, wherein the dispensing of epoxy into each pin hole and each recess of each of said plurality of assembly packages is performed within about two minutes after the plurality of assembly packages begins to cool.

7. The method of making the assembly package according to claim 6, wherein said gelling and hardening of the epoxy begins to take place before the temperature of the assembly package decreases to below said second temperature.

8. The method of making the assembly package according to claim 1, wherein said at least one post consists of two posts, whereby said dielectric base is formed with two recesses.

9. The method of making the assembly package according to claim 1, further comprising the step (i) of stamping and gulling said outer end of each of said plurality of conductive leads to form an individual assembly package.

10. The method of making the assembly package according to claim 1, wherein the thermally setting epoxy used in step (d) is epoxy resin NPR-770 NP4 manufactured by Japan Rec Co., Ltd.

11. The method of making the assembly package according to claim 1, wherein the thermally setting epoxy used in step (f) is epoxy resin NPR-770 NP4 manufactured by Japan Rec Co., Ltd.

12. A method of making an assembly package having an air tight cavity for housing a circuitry, said assembly having a plurality of conductive leads extending outwardly from a conductive pad, each of said conductive leads having an inner end portion said method comprising the steps of:

(a) forming a dielectric base by transfer molding by injecting a thermally setting epoxy into the cavity space of a mold die, said space being shaped to hold said conductive pad and said inner end portion of each of said plurality of conductive leads in a mold die, wherein a pin is disposed within said mold die such that the resulting dielectric base formed by transfer molding has a pin hole formed therein;

(b) bonding said circuitry to the conductive pad;

(c) wire bonding the conductive leads to said circuitry;

(d) covering the circuitry with a plastic shell having a rim disposed about the periphery thereof;

(e) bonding said rim of said shell to said plurality of conductive leads and said dielectric base with a thermally setting epoxy;

(f) heating to a first elevated temperature and curing said epoxy bonding said rim of said shell to said plurality of conductive leads and said dielectric base wherein said pin hole in said dielectric base provides a path for the heated air in the cavity formed by the shell and the electric base to escape;

(g) heating said assembly having a second elevated temperature;

(h) cooling said assembly to a third elevated temperature, said third elevated temperature being lower than said second elevated temperature;

(i) filling said pin hole with a thermally setting epoxy to seal the cavity formed by the shell and the dielectric base while the assembly is being cooled to said lower third temperature; and (j) gelling, hardening and curing the epoxy in the pin hole, thereby forming and air tight cavity housing said circuitry.

13. The method of making an assembly package according to claim 12, wherein said steps of sealing, gelling, hardening and curing the pin hole with the thermally setting epoxy further comprises the step of filling the pin hole after the assembly begins to cool from said second elevated temperature to said lower third temperature, wherein the filling of the pin hole is timed such that epoxy begins to gel and harden before the assembly reaches the lower temperature.

14. The method of making an assembly package according to claim 11, wherein a plurality of the assembly packages are made in a batch, wherein the higher temperature is set such that the cooling time to said lower third temperature is sufficiently long enough to allow the filling in of each of said pin holes in each of said plurality of assembly packages with said thermally setting epoxy and gelling and hardening the epoxy before the assemblies are cooled down toward the lower temperature.

15. The method of making the assembly package according to claim 12, wherein the thermally setting epoxy used in step (d) is epoxy resin NPR-770 NP4 manufactured by Japan Rec Co., Ltd.

16. The method of making the assembly package according to claim 12, wherein the thermally setting epoxy used in step (f) is epoxy resin NPR-770 NP4 manufactured by Japan Rec Co., Ltd.

17. An assembly package made by the method of claim 13.

18. An assembly package made by the method of claim 14.

19. The method of making the assembly package according to claim 12, wherein the thermally setting epoxy used in step (a2) is epoxy resin Sumitomo EME 6300H, manufactured by Sumitomo Industries, Inc.

* * * * *